United States Patent
Cho et al.

(10) Patent No.: US 6,759,348 B1
(45) Date of Patent: Jul. 6, 2004

(54) PATTERN AND ITS FORMING METHOD OF LIQUID CRYSTAL DISPLAY DEVICE

(75) Inventors: So-Haeng Cho, Seoul (KR); Yong-Jin Cho, Seoul (KR); Dong-Hoon Lee, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/422,745

(22) Filed: Apr. 25, 2003

(30) Foreign Application Priority Data

Dec. 31, 2002 (KR) ................................ 10-2002-0088447

(51) Int. Cl.⁷ ........................ H01L 21/461; H01L 21/31
(52) U.S. Cl. ..................................................... 438/778
(58) Field of Search ............................... 438/778, 694, 438/725, 780

(56) References Cited

U.S. PATENT DOCUMENTS

| | | | |
|---|---|---|---|
| 4,294,650 A | 10/1981 | Werthmann | 156/660 |
| 5,259,926 A | 11/1993 | Kuwabara et al. | 156/659.1 |
| 5,514,503 A | 5/1996 | Evans et al. | 430/7 |
| 5,544,582 A | 8/1996 | Bocko et al. | 101/211 |
| 5,678,483 A | 10/1997 | Johnson | 101/153 |
| 5,701,815 A | 12/1997 | Bocko et al. | 101/211 |
| 6,001,515 A | 12/1999 | Evans et al. | 430/7 |
| 6,356,318 B1 | 3/2002 | Kawahata | 349/38 |
| 2003/0084796 A1 * | 5/2003 | Kwon et al. | 101/41 |
| 2003/0121429 A1 * | 7/2003 | Lee et al. | 101/41 |
| 2003/0124866 A1 * | 7/2003 | Kim et al. | 438/694 |

FOREIGN PATENT DOCUMENTS

| | | |
|---|---|---|
| EP | 0 471 628 A1 | 2/1992 |
| JP | 63205608 | 8/1988 |
| JP | 4094115 | 2/1992 |
| JP | 5011270 | 1/1993 |

* cited by examiner

Primary Examiner—Craig A. Thompson
(74) Attorney, Agent, or Firm—Morgan, Lewis & Bockius LLP

(57) ABSTRACT

A method for forming a pattern includes filling a resist in a groove of a cliché corresponding to the position of the pattern to be formed, transferring the resist which is filled in the groove onto a printing roll by rotating the printing roll in a direction parallel to the longest portion lengthwise direction of a pattern formed in cliché, and applying the resist on an etching object layer by rotating the printing roll along the etching object layer on a substrate.

11 Claims, 7 Drawing Sheets

PATTERN AND ITS FORMING METHOD OF LIQUID CRYSTAL DISPLAY DEVICE

This application claims the benefit of Korean Application No. 2002-88447 filed in Korea on Dec. 31, 2002, which is hereby incorporated by reference in its entirety.

BACKGROUND OF THE INVENTION

1. Field of the Invention

The present invention relates to a method for forming a Liquid Crystal Display (hereinafter, LCD) device and particularly, a method for forming a pattern in the LCD device.

2. Description of the Related Art

In display devices, particularly in flat panel display devices, pixels are arranged in a matrix. Further, in flat panel devices, such as LCD devices, an active device, such as Thin Film Transistors (hereinafter, TFTs) are positioned in respective pixels for driving the pixels in the display devices. This method of driving the display device is called the active matrix driving method because the active devices are arranged in the respective pixels aligned in a matrix form.

FIG. 1 is a plan view of a pixel in a related art LCD device using the active matrix method. The active device is a TFT 10. As shown in FIG. 1, gate lines 2 arranged lengthwise and data lines 4 arranged widthwise define a pixel. The TFT 10 for independently controlling the driving of the respective pixel is formed near where one of the gate lines and one of the data lines cross over each other. The TFT 10 includes a gate electrode 2a, which is connected with one of the gate lines 2, a semiconductor 5 that is formed on the gate electrode 2a, and source and drain electrodes 4a and 4b that are formed on the semiconductor layer 5. The TFT 10 is activated when a scan signal is applied to the gate electrode 2a by one of the gate lines 2. In the pixel, a pixel electrode 7, which is connected to the drain electrodes 4b, is supplied with an image signal through the source and drain electrodes 4a and 4b when the semiconductor layer 5 is activated by the gate electrode 2a. The pixel electrode 7 is connected with the drain electrode 4b through the first contact hole 8a. A storage line 6 and a storage electrode 11, which overlaps the storage line 6, are positioned in the pixel defined by the gate line 2 and the data line 4 to form a storage capacitor Cst. The storage electrode 11 is connected with the pixel electrode 7 through a second contact hole 8b.

FIG. 2 is a cross-sectional view taken along section line II–II' of FIG. 1 showing a TFT 10 and storage capacitor Cst positioned inside the pixel. As shown in FIG. 2, the TFT 10 includes a substrate 1 made of transparent insulating material, such as glass, a gate electrode 2a formed on the substrate 1, a gate insulating layer 13 deposited over the entire substrate 1, a semiconductor layer 5 formed on the gate insulating layer 13 and source/drain electrodes 4a and 4b formed on the semiconductor layer 5, and a passivation layer 15 formed on the source/drain electrodes 4a and 4b to protect the device, and a pixel electrode 7 connected with the drain electrode 4b through the first contact hole 8a.

The storage capacitor Cst includes a storage line 6 formed during the same series of patterning processes as the gate electrode 2a of the TFT, and a storage electrode 11 formed during the same series of patterning processes as the source and drain electrodes 4a and 4b. A gate insulating layer 13 is formed between the storage line 6 and storage electrode 11. A second contact hole 8b for exposing a part of the storage electrode 11 is formed in the passivation layer 15. The storage electrode 11 is electrically connected with the pixel electrode 7 through the second contact hole 8b. The storage capacitor Cst charges via a gate voltage while a gate signal is applied to the gate electrode 2a, and then holds charge until the gate electrode 2 is selected in the next frame to prevent voltage change of the pixel electrode 7.

As described above, the LCD device is fabricated by a photolithography processing having a series of repeated processes, such as coating a photo-resist, aligning, exposing, developing, rinsing and the like to develop different portions of a pattern. Because a plurality of photolithography processes must be repeated to complete the LCD device, the productivity is degraded.

SUMMARY OF THE INVENTION

Accordingly, the present invention is directed to a flat display device that substantially obviates one or more of the problems due to limitations and disadvantages of the related art.

Therefore, an object of the present invention is to provide a method for forming a pattern on a liquid crystal display (hereinafter, as LCD) device, capable of forming a pattern through a printing processing that does not have to be repeated.

Another object of the present invention is to provide a method for forming an accurate pattern in both a non-rollout direction and a rollout direction of the pattern.

Still another object of the present invention is to provide a pattern feature for forming an accurate pattern.

To achieve these and other advantages and in accordance with the purpose of the present invention, as embodied and broadly described herein, there is provided a method for forming a pattern including filling a resist in a groove of a cliché corresponding to the position of the pattern to be formed, transferring the resist which is filled in the groove onto a printing roll by rotating the printing roll in a direction parallel to the longest portion lengthwise direction of a pattern formed in cliché, and applying the resist on an etching object layer by rotating the printing roll along the etching object layer on a substrate.

In another aspect, a method for forming a pattern includes providing a cliché in which a groove is formed in a region corresponding to a shape of a pattern to be formed, filling a resist into the groove and removing the resist which remains on the surface of the cliché except for resist within the groove by pulling a doctor blade in a pulling direction parallel a longest portion lengthwise direction of the groove to flatten the resist, transferring the resist onto a printing roll by rotating the printing roll on the cliché along the longest portion lengthwise direction of the groove, and applying the resist on the etching object layer by rotating the printing roll along the an etching object layer on a substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
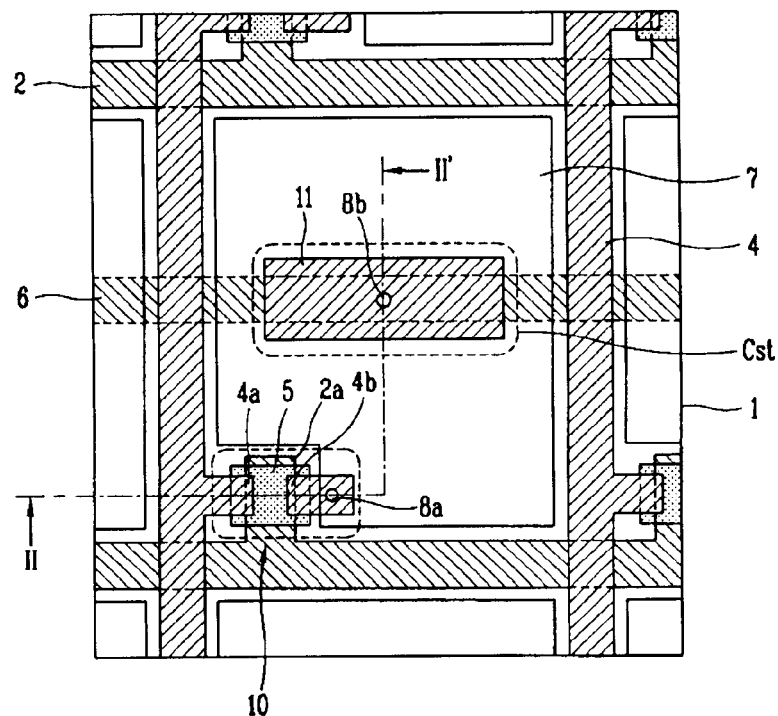
FIG. 1 is a plan view of a pixel in a related art LCD device.
Figure 2:
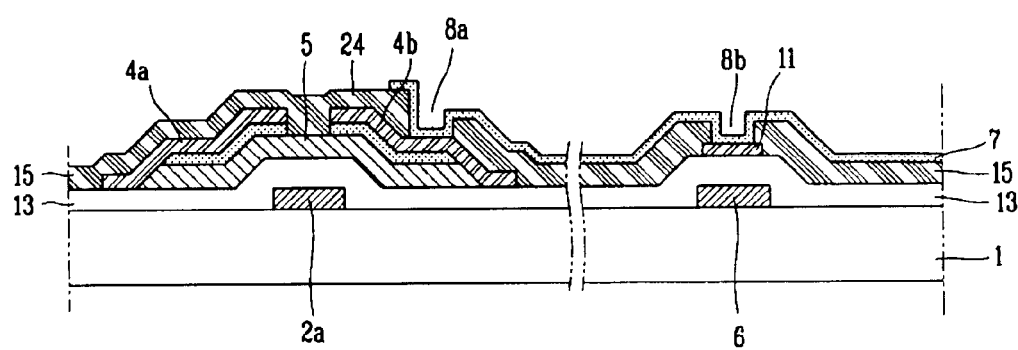
FIG. 2 is a cross-sectional view taken along section line II—II' of FIG. 1, showing the thin film transistor and a storage capacitor in the pixel.
Figure 3A:
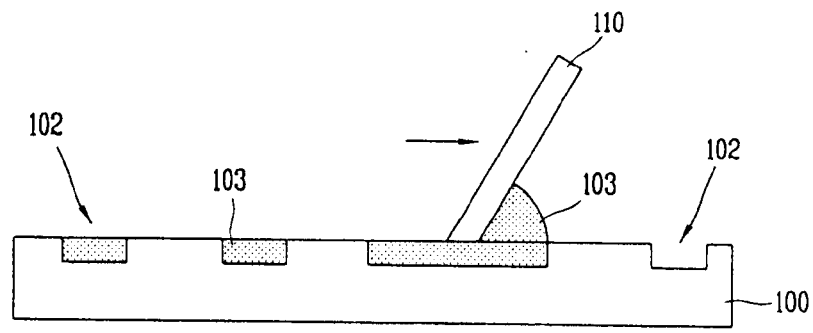
FIGS. 3A to 3C are views illustrating a method for forming a resist pattern on a substrate by using a printing method in accordance with an exemplary embodiment of the present invention.
Figure 3B:
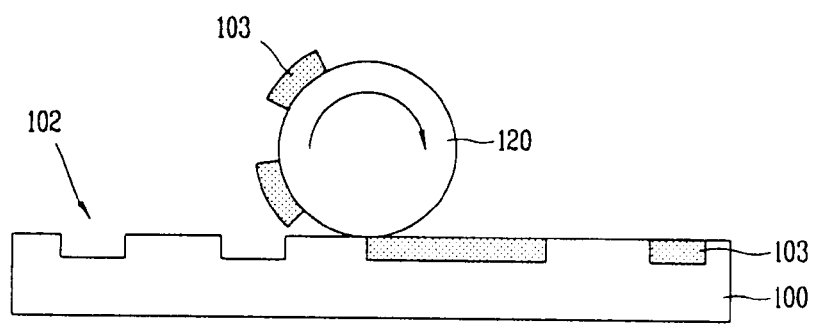
Figure 3C:
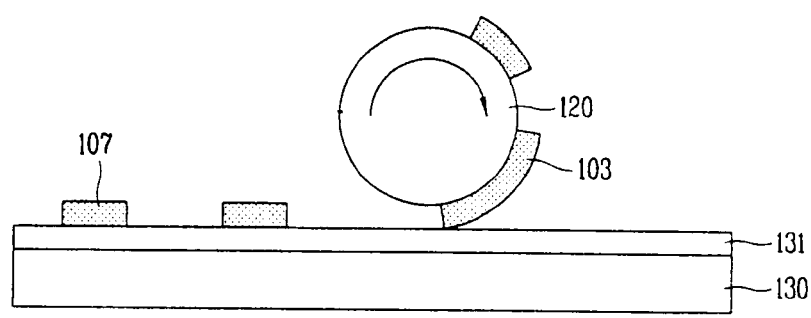

FIGS. 3A to 3C are views illustrating a method for forming a resist pattern on a substrate by using a printing method in accordance with an exemplary embodiment of the present invention. As shown in FIG. 3A, after providing cliché 100 in which grooves 102 are formed in shapes and positions corresponding to a pattern to be formed on a substrate, a resist 103 is filled into the cliché 100. For example, the an amount of the resist that will more than fill the grooves 102 is disposed upon the surface of the cliché 100 and is pulled into the grooves 102 by a doctor blade 110 to flatten the resist into the grooves and then excess resist is whisked off. The doctor blade 110 should be pulled in a direction that is along the longest length of groove. Otherwise, if the doctor blade 110 is pulled in a direction perpendicular or not parallel to longest length of the groove, the resist might not fill the groove 102 smoothly along its longest length such that subsequent processes can remove resist from the cliché 100.

As shown in FIG. 3B, the resist 103 filled into the groove 102 of the cliché 100 is transferred onto the surface of a rotating printing roll 120 when printing roll 120 is rolled across the surface of the cliché 100. The printing roll 120 has the same width as that of the panel of the display device to be fabricated. Further, the printing roll has a circumference that is identical to the length of the panel of the display device to be fabricated. Therefore, the resist 103 filled into the groove 102 of the cliché 100 is transferred onto the circumferential surface of the printing roll 120.

As shown in FIG. 3C, the printing roll 120 with the resist 103 on the circumferential surface is rolled across the surface of an etching object layer 131 formed on a substrate 130 to apply the resist 103 to the etching object layer 131, and a resist pattern 107 is formed by drying the applied resist 107 with a scanning UV light or applying heat. Preferably, the pattern 107 necessary for the entire patterning process step for the etching object layer can be formed over the entire substrate 120 of the display device by rotating the printing roll 120 once across the etching object layer 131. Accordingly, since the cliché 100 and printing roll 120 can be fabricated according to the size of the preferable display device and the pattern can be formed on the substrate 130 by a one time application, the patterning of a large-area display device for an etching object layer can be performed in a single series of patterning processes.

The etching object layer 131 can be a metal layer for forming a metal pattern, such as the gate electrodes of the TFTs and the storage electrode. In another example, the metal layer can be for forming the source/drain electrodes, gate lines and data lines. In the alternative, the etching object layer can be an insulating layer, such as $SiO_x$ or $SiN_x$ or a semiconductor layer. After forming the resist pattern 107 on the etching object layer, the desired pattern can be formed by etching the etching object layer using conventional etching processes. The shape of the pattern 107 formed on the substrate depends on the rotation direction or rollout direction of the printing roll, and in particular, depends on an angle between the rolling direction of the print roller and the longest portion lengthwise direction of the pattern. Here, the longest portion lengthwise direction of the pattern is the direction of the longest feature of a pattern.

Figure 4A:
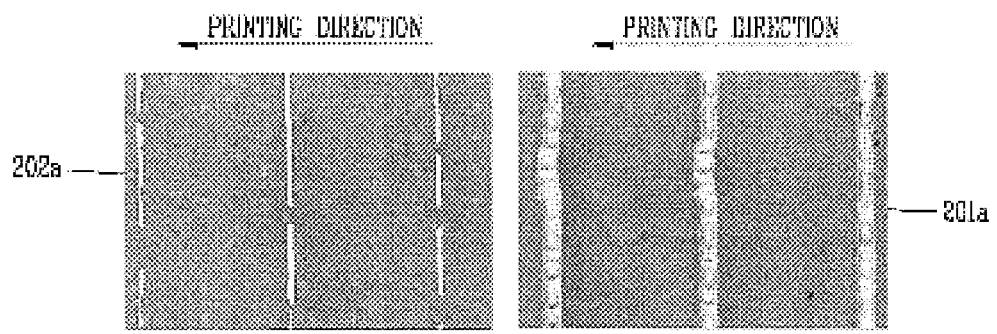
FIGS. 4A to 4C are views showing the shape of the pattern obtained through actual experiment results according to the angle between the print rollout direction and the lengthwise direction of the pattern.
Figure 4B:
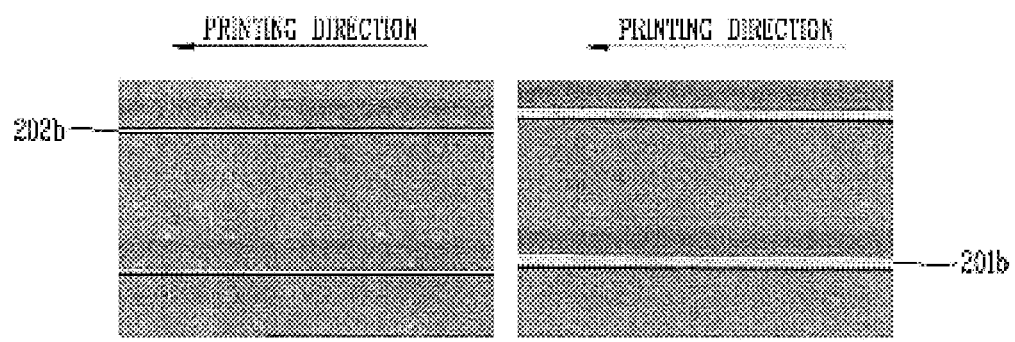
Figure 4C:
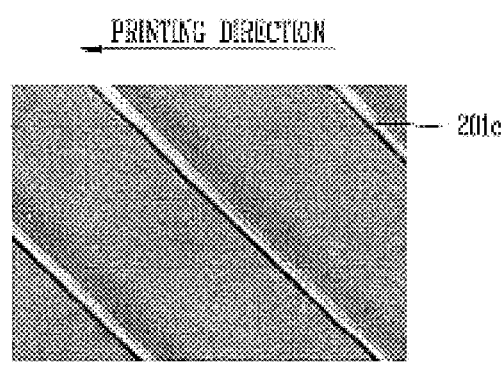

FIGS. 4A to 4C are views showing the shape of the pattern obtained through actual experiment results according to the angle between the print rollout direction and the longest portion lengthwise direction of the pattern. FIG. 4A shows the shape of a pattern when the printing rollout direction is transverse to the lengthwise direction of the pattern. FIG. 4B shows the shape of a pattern when the printing rollout direction is in the same direction as the longest portion lengthwise direction of the pattern. FIG. 4C shows the shape of a pattern when the printing rollout direction is at an angle of 45° (degrees) to the longest portion lengthwise direction of the pattern.

In the case of printing rollout direction transverse to the longest portion lengthwise direction of the pattern, as shown in FIG. 4A, an accurate pattern was not formed in pattern 202a having a line width of 25 μm and the pattern defect of disconnection was created in the middle. In pattern 201a having a line width of 50 μm, the pattern defect of a disconnection is not generated but an accurate pattern was not obtained. In the case of a printing rollout direction in the same direction as the longest portion lengthwise direction of the pattern, as shown in FIG. 4B, very clear patterns can be obtained for patterns 202b and 202a having widths of 25 μm and 50 μm, respectively. Further, in the case of printing rollout direction of an angle of 45° (degrees) to the longest portion lengthwise direction of the pattern, as shown in FIG. 4C, the pattern 201c is not as accurate as a pattern in which the printing rollout direction is the same direction as the longest portion lengthwise direction, but satisfactory patterns without defects such as transformation or disconnection can be obtained. FIG. 4C only shows a pattern with a width of 50 μm. Therefore, in forming a pattern by the printing method, an accurate pattern can be formed by rolling the print roller having the resist pattern in a printing rollout direction that is the same as the longest portion lengthwise direction of the pattern.

Figure 5:
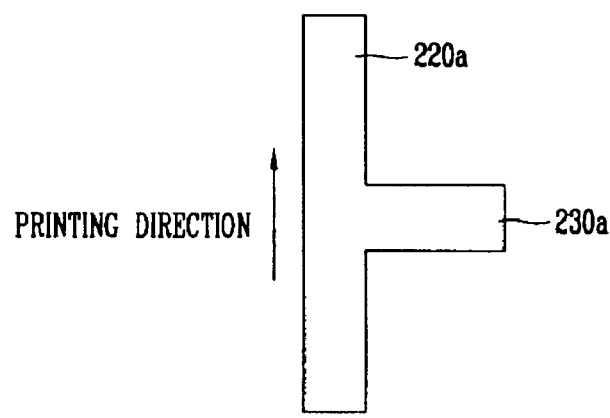
FIG. 5 is a view showing a structure of patterns which are vertical to each other for an identical layer.
Figure 6:
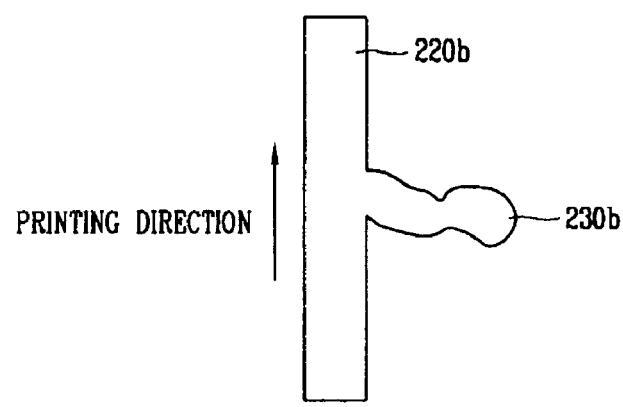
FIG. 6 is a view showing defection of the pattern positioned vertically to the printing direction.

Patterns of an LCD device do not run in only one direction. As shown in FIG. 5, patterns can have features that run transverse to each other in the same layer on which patterning is simultaneously performed for all features that will be made from an etching object layer. For example, a first feature 220a in FIG. 5 can be a gate line or a data line and a second feature 230a can be a gate electrode, which protrudes from the gate line, or a data electrode, which protrudes from the data line. When rolling out the pattern in the lengthwise direction of the first pattern 220a, as shown in FIG. 6, an accurate shape is formed for the first feature 220b and the second feature 230b is defective in that it has a distorted shape.

Figure 7A:
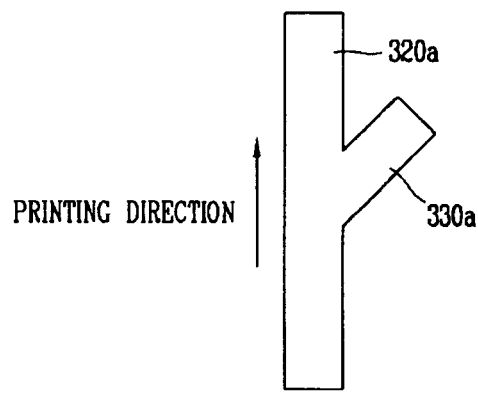
FIGS. 7A to 7C show patterns according to an exemplary embodiment having features that will not be defective although the lengthwise direction of the pattern features is not the same as the printing rollout direction that will be used to apply the entire pattern.
Figure 7B:
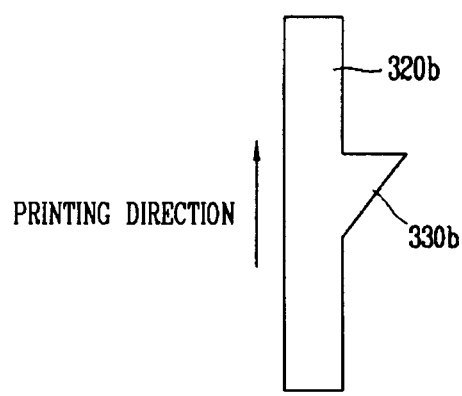
Figure 7C:
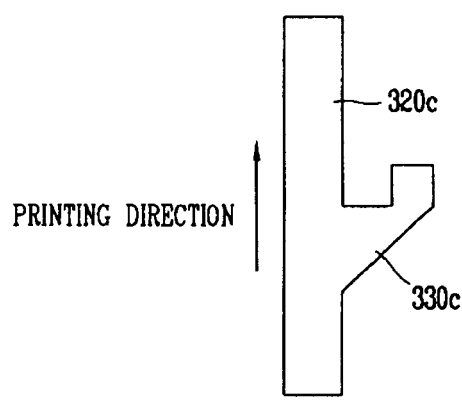

FIGS. 7A to 7C show patterns having features that will not be defective although the lengthwise direction of the pattern features is not the same as the printing rollout direction that will be used to apply the entire pattern. FIG. 7A shows a pattern having a first pattern feature 320a and a second pattern feature 330a, which is formed to have, a side at an angle smaller than 90° from the longest portion lengthwise direction of the first pattern 320a. The angle between the first pattern 320a and the second pattern 330a can be differentiated based upon the distance that the second pattern 330a projects from the first pattern 320a. As the distance becomes shorter, the resolution of the angle becomes smaller. In the case where the distance of the second pattern 330a is as large as the width of the second pattern 330a, the angle appears to become close to 90°. Therefore, in this exemplary embodiment, the angle is not limited to a certain value.

As shown in FIGS. 7B and 7C, printing defects in a pattern generated by features having a different lengthwise direction can be prevented by designing a feature, such as 330b, so that it has a reduced profile along the printing direction. In the alternative, the feature, such as 330c, has both a reduced profile and a portion that is in parallel to the printing direction.

Figure 8A:
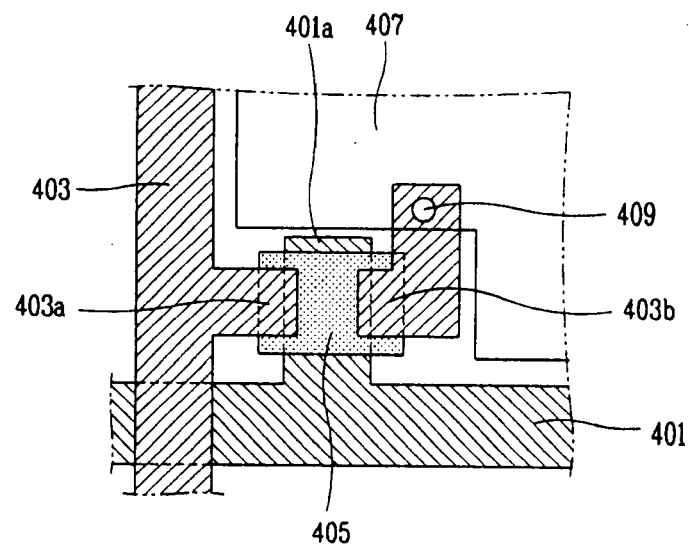
FIG. 8A is a plan view showing the pattern of a prior art TFT having a "I"-shaped channel.

FIG. 8A is a plan view showing the pattern of a prior art TFT having an "I"-shaped channel. As shown in FIG. 8A, in the conventional TFT, a semiconductor layer 405 is positioned on a gate electrode 401a, which protrudes vertically from a gate line 401. A source electrode 403a and a drain electrode 403b are separated at a predetermined interval and positioned on the semiconductor layer 405. The source electrode 403a protrudes vertically from the data line 403. Also, the drain electrode 403b extends into the pixel region and contacts a pixel electrode 407 through a contact hole 409. In the case of printing the gate electrode 401a and the source/drain electrodes 403a and 403b, because printing of the pattern is in a direction of the gate line 401 and the data line 403, which are vertically positioned to the gate electrode 401a and the source/drain electrodes 403a and 403b, respectively, a printing defect can occur in the gate electrode 401a and the source/drain electrodes 403a and 403b.

Figure 8B:
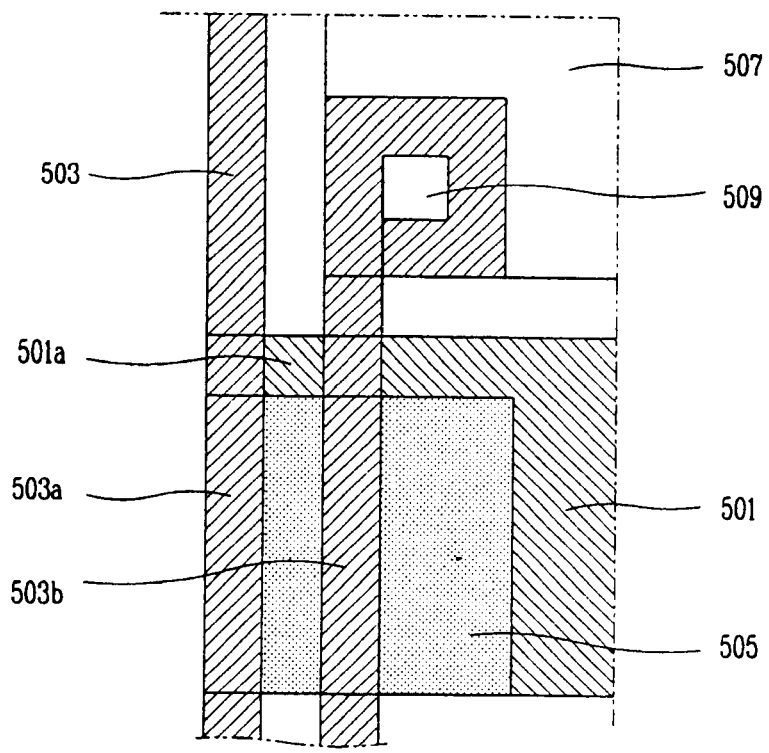
FIG. 8B is a plan view showing the pattern for preventing the generation of defects in a TFT having an "I"-shaped channel according to an exemplary embodiment of the invention.

FIG. 8B is a plan view showing the pattern for preventing the generation of defects in TFT having an "I"-shaped channel according to an exemplary embodiment of the invention. As shown in FIG. 8B, by having a gate electrode 501a and a source electrode 503a, which are the gate line 501 and the data line 503, respectively. Accordingly, there are no electrodes protruding perpendicularly to the printing direction that can cause defects. More particularly, a first resist is used to etch an object layer to form a drain electrode and a data line along a first printing direction. Then, another resist is used to etch another object layer to form a gate electrode along a second printing direction perpendicular to the first printing direction.

By positioning the drain electrode 503b in parallel to the data line 503 in a first printing direction and gate electrode 501a in a second printing direction perpendicular to the first printing direction (lengthwise direction of the gate line and the data line), all of the patterns can be made with high accuracy. Accordingly, printing defects in the patterns (gate electrode, source/drain electrodes) can be prevented. At this time, a semiconductor layer 505 is positioned to be included on the gate line 501.

Figure 9A:
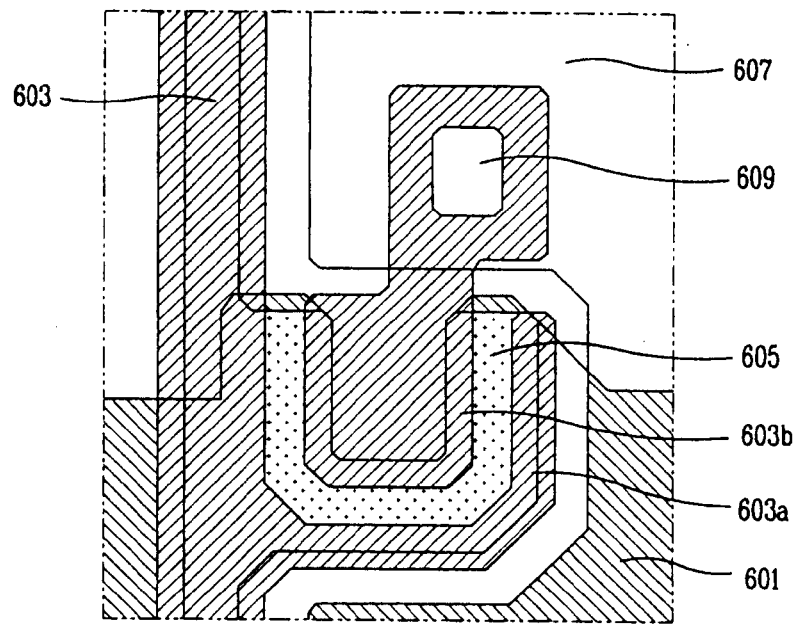
FIG. 9A is a plan view showing the pattern of a prior art TFT having a "U"-shaped channel.

FIG. 9A is a plan view showing the pattern of a prior art TFT having a "U"-shaped channel. In the TFT having the conventional U-shaped channel, a source electrode 603a coming from a data line 603 is formed on the semiconductor layer 605 as a U-shape. A drain electrode 603b, which is separated at a predetermined interval from the source electrode 603a, is electrically connected with a pixel electrode 607 through a contact hole 609.

Figure 9B:
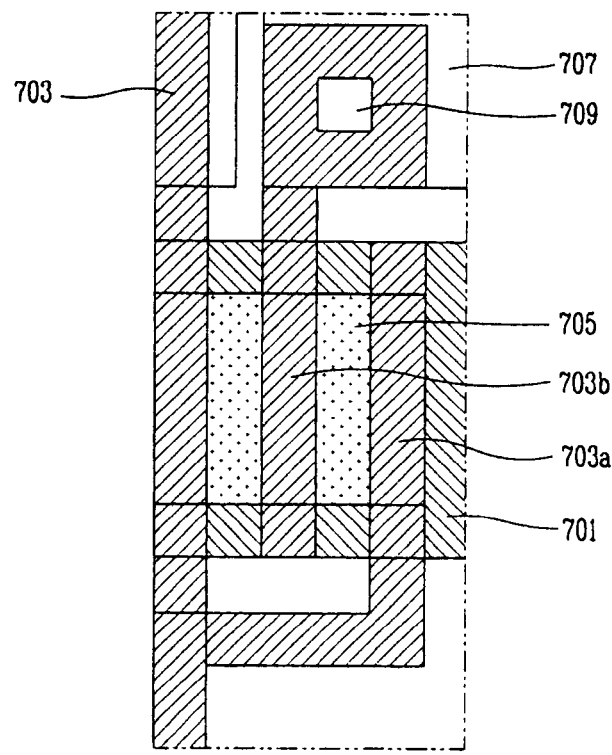
FIG. 9B is a plan view showing the pattern for preventing the generation of defects in a TFT having a "U"-shaped channel according to an exemplary embodiment of the invention.

FIG. 9B is a plan view showing the pattern for preventing the generation of defects in TFT having a "U"-shaped channel according to an exemplary embodiment of the invention. As shown in FIG. 9B, a semiconductor layer 705 is positioned on a gate line 701. Further, a data line 703 and a source electrode 703a connected to the data line are positioned in parallel with a drain electrode 703b. Two "I"-shaped channels are formed in parallel by a boundary of the source electrode 703a. Therefore, a printing defect in channel layer, that is, semiconductor layer 705 can be prevented.

The pattern for the parallel data line 703 and source electrode 703 are formed in a groove within the cliché. More particularly, the pattern includes a long groove in parallel to a short groove that are interconnected by a crossing groove. The crossing groove can have sides slope toward the printing direction.

As described above, by changing the features of the patterns for the electrodes and the semiconductor layer to accommodate for the printing direction of the patterns, an LCD device having an accurate pattern can be formed to prevent defects. Also, the present invention can be applied to other patternable layers, which are patterned using the pattern printing method. Further, a pattern can be accurately formed by changing the features of the pattern to be closer to the printing method for patterns of which print-progressing direction and the lengthwise direction are vertical to each other or not identical.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for forming a pattern, comprising:
    filling a resist in a groove of a cliché corresponding to the position of the pattern to be formed;
    transferring the resist which is filled in the groove onto a printing roll by rotating the printing roll in a direction parallel to the longest portion lengthwise direction of a pattern formed in cliché; and
    applying the resist on an etching object layer by rotating the printing roll along the etching object layer on a substrate.

2. The method of claim 1, wherein the step of filling the resist in the groove of the cliché includes:
    applying the resist on the cliché;
    filling the resist in the groove by pulling a doctor blade in a pulling direction across the surface of the cliché to flatten the resists into the grooves; and removing excess resist that remains on the surface of the cliché except for in the groove.

3. The method of claim 2, wherein the pulling direction is parallel to the longest portion lengthwise direction of the pattern formed in cliché that is parallel to a longest length groove in the cliché.

4. The method of claim 1, wherein the etching object layer includes a metal layer.

5. The method of claim 1, wherein the etching object layer includes an insulating layer which is composed of $SiO_x$ or $SiN_x$.

6. The method of claim 1, wherein the etching object layer includes a semiconductor layer.

7. The method of claim 1, further comprising:

providing a cliché for a pattern having a first pattern feature along the longest portion lengthwise direction and a second pattern feature protruding from the first pattern feature, wherein the second pattern feature has a side at an angle smaller than 90° from the longest portion lengthwise direction of the first pattern feature.

8. The method of claim 1, further comprising:

providing a cliché for a pattern having a first pattern feature along the longest portion lengthwise direction, a second pattern feature in parallel with the first pattern feature, and third pattern feature interconnecting the first and second pattern features.

9. A method for forming a pattern, comprising:

providing a cliché in which a groove is formed in a region corresponding to a shape of a pattern to be formed;

filling a resist into the groove and removing the resist which remains on the surface of the cliché except for resist within the groove by pulling a doctor blade in a pulling direction parallel a longest portion lengthwise direction of the groove to flatten the resist;

transferring the resist onto a printing roll by rotating the printing roll on the cliché along the longest portion lengthwise direction of the groove; and applying the resist on the etching object layer by rotating the printing roll along the an etching object layer on a substrate.

10. The method of claim 9, further comprising:

providing a cliché for a pattern having a first pattern feature along the longest portion lengthwise direction and a second pattern feature protruding from the first pattern feature, wherein the second pattern feature has a side at an angle smaller than 90° from the longest portion lengthwise direction of the first pattern feature.

11. The method of claim 9, further comprising:

providing a cliché for a pattern having a first pattern feature along the longest portion lengthwise direction, a second pattern feature in parallel with the first pattern feature, and third pattern feature interconnecting the first and second pattern features.

* * * * *